(12) United States Patent
Fischer et al.

(10) Patent No.: US 8,174,082 B2
(45) Date of Patent: May 8, 2012

(54) MICROMECHANICAL COMPONENT HAVING MULTIPLE CAVERNS, AND MANUFACTURING METHOD

(75) Inventors: Frank Fischer, Gomaringen (DE); Eckhard Graf, Gomaringen (DE); Heiko Stahl, Reutlingen (DE); Hartmut Kueppers, Reutlingen (DE); Roland Scheuerer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 431 days.

(21) Appl. No.: 11/628,100

(22) PCT Filed: Apr. 28, 2005

(86) PCT No.: PCT/EP2005/051917
§ 371 (c)(1),
(2), (4) Date: Sep. 14, 2007

(87) PCT Pub. No.: WO2005/118463
PCT Pub. Date: Dec. 15, 2005

(65) Prior Publication Data
US 2008/0136000 A1    Jun. 12, 2008

(30) Foreign Application Priority Data
Jun. 4, 2004   (DE) .................. 10 2004 027 501

(51) Int. Cl.
*H01L 27/14* (2006.01)
(52) U.S. Cl. ................ 257/414; 257/682; 257/E23.128; 257/E21.505; 438/53; 438/106; 438/126

(58) Field of Classification Search .................. 257/682, 257/E23.128, E21.505
See application file for complete search history.

(56) References Cited

U.S. PATENT DOCUMENTS

| | | | |
|---|---|---|---|
| 5,310,450 A * | 5/1994 | Offenberg et al. ................ 216/2 |
| 6,433,390 B1 | 8/2002 | Hara | |
| 2002/0048536 A1* | 4/2002 | Bergh et al. .................... 422/130 |
| 2002/0096743 A1 | 7/2002 | Spooner et al. | |
| 2003/0116813 A1* | 6/2003 | Benzel et al. .................. 257/414 |
| 2004/0113215 A1* | 6/2004 | Shimada et al. ............... 257/414 |

FOREIGN PATENT DOCUMENTS

| | | |
|---|---|---|
| DE | 197 00 734 | 7/1998 |
| DE | 198 26 426 | 12/1999 |
| DE | 100 17 422 | 10/2001 |
| DE | 101 04 868 | 8/2002 |
| DE | 102 43 014 | 9/2002 |
| EP | 1 167 979 | 1/2002 |
| JP | 2002 5950 | 1/2002 |
| JP | 2002-510863 | 4/2002 |
| JP | 2002-273699 | 9/2002 |
| JP | 2003-530234 | 10/2003 |
| WO | WO 99/50905 | 10/1999 |

\* cited by examiner

*Primary Examiner* — Fernando L Toledo
*Assistant Examiner* — Mark A Laurenzi
(74) *Attorney, Agent, or Firm* — Kenyon & Kenyon LLP

(57) ABSTRACT

A micromechanical component having at least two caverns is provided, the caverns being delimited by the micromechanical component and a cap, and the caverns having different internal atmospheric pressures. The micromechanical component and cap are hermetically joined to one another at a first specifiable atmospheric pressure, then an access to at least one cavern is produced, and subsequently the access is hermetically closed off at a second specifiable atmospheric pressure.

21 Claims, 4 Drawing Sheets

MICROMECHANICAL COMPONENT HAVING MULTIPLE CAVERNS, AND MANUFACTURING METHOD

FIELD OF THE INVENTION

The present invention relates to a micromechanical component, and a method for manufacturing a micromechanical component.

BACKGROUND INFORMATION

It is known from the existing art that discrete sensors, e.g., rotation-rate sensors and acceleration sensors, can be manufactured micromechanically. It is likewise known that rotation-rate and acceleration sensors can be integrated in a common housing, together with one or more evaluation circuits, to constitute a sensor system. It is furthermore known to integrate micromechanical sensors and the associated evaluation circuit monolithically. Published German patent document DE 101 04 868 describes the packaging of a micromechanical sensor by way of a cap. The sensor and cap are anodically bonded, and delimit a cavern. It is furthermore described in published German patent document DE 102 43 014 to dispose two caverns in one micromechanical component.

SUMMARY

The micromechanical component according to the present invention has at least two caverns having different internal pressures. This advantageously makes possible the integration of multiple different micromechanical sensors, having different internal atmospheric pressures as determined by their design, into one common micromechanical component. In a micromechanical acceleration sensor the internal atmospheric pressure in the cavern is specified, for example, as 5 mbar to 1.5 bar. With this pressure, a suitable damping for the micromechanical deflection part of acceleration sensors can be established. For actively oscillating sensors, e.g., for rotation-rate sensors, the internal cavern pressure that is chosen should be very low in order to ensure high quality for the oscillator. Internal cavern pressures of $<10^{-3}$ bar are advantageous here.

An advantageous example embodiment of the micromechanical component provides for at least two caverns to be delimited by one common cap. This makes possible a particularly compact construction for the micromechanical component. The number of steps for manufacturing such a component can moreover be reduced thereby. In particular, these two caverns have different internal atmospheric pressures.

It is also advantageous that at least one cavern has a closed-off access opening. A specifiable pressure in the cavern can easily be established by way of such an access opening.

A further advantageous example embodiment of the micromechanical component according to the present invention provides for the access opening to exist through a component substrate. Here the access opening can be particularly easily provided, and also closed off again, during sensor production.

It is also advantageous if the micromechanical component has a buried conductor structure. Buried conductor structures make it possible to configure the joining surface between the cap and the micromechanical component in particularly flat, and therefore sealed, fashion.

A particularly advantageous example embodiment of the micromechanical component according to the present invention provides for the component to have, at a contact region of a component substrate, at least one means for electrical contacting, in particular a metallization. This embodiment enables all the contacts and unburied conductor structures of the micromechanical component to be guided on the uncapped side of the micromechanical component, thus advantageously making possible complete capping of one side of the micromechanical component.

It is also advantageous that at least one cavern of the micromechanical component is sealed by way of a peripheral hermetic material join. The specified internal pressure in the cavern is thereby advantageously maintained over the service life of the micromechanical component.

It is also advantageous if several caverns are sealed by way of a common peripheral hermetic material join. Advantageously, regions of the micromechanical component can thus be provided with the same pressure in the relevant caverns. It is furthermore also possible to provide regions of differing pressure, in particular of stepwise better vacuum.

An advantageous example embodiment of the micromechanical component according to the present invention provides for the cap to be made of a silicon substrate that is joined to a glass layer. Such a cap can be particularly easily mounted with its glass layer onto a micromechanical component made of silicon, and secured by anodic bonding.

It is also advantageous if the cap, in particular the glass layer, has at least one recess to form a cavern. The recess in the cap advantageously enlarges the cavern. More space for micromechanical functional parts therefore exists in the cavern.

The method according to the present invention for manufacturing a micromechanical component provides that the micromechanical component and the cap are hermetically joined to one another at a first specifiable atmospheric pressure, an access to at least one cavern is then created, and then the access is hermetically closed off at a second specifiable atmospheric pressure. It is advantageous in this context that at least for one cavern, the internal atmospheric pressure can be already be specified during the process step of capping.

It is furthermore advantageous that different internal atmospheric pressures are specifiable in the individual caverns, with the result that, for example, different micromechanical sensors, having different pressures as determined by their design, can be manufactured.

It is moreover advantageous that the caverns made up of a cap and micromechanical component can be manufactured by way of joining processes at practically any desired process pressure, since the internal cavern pressure is still modifiable retrospectively by way of the access.

An advantageous example implementation of the method according to the present invention provides for the cap to be manufactured from a silicon substrate and a glass which are joined to one another by anodic bonding. It is advantageous in this context that in this easy fashion a cap can be manufactured and joined to a micromechanical component in a further process step of anodic bonding.

A further advantageous example implementation of the method provides for at least one recess to be produced in the glass, in particular by etching, in order to form a cavern. Advantageously, this example implementation enables the manufacture of a cap that makes possible, proceeding from a flat substrate and a flat glass, the formation of the largest possible cavern.

It is also advantageous that the micromechanical component and the cap are joined to one another by anodic bonding. Anodic bonding makes possible the production of hermetic joins.

It is furthermore advantageous that the access is produced in a component substrate of the micromechanical component. The access is produced, in simple and economical fashion, in the same manufacturing step in which trenches for the electrical insulation of parts of the component are introduced into the component substrate of the micromechanical component.

An advantageous example implementation of the method according to the present invention provides for the access to be closed off by way of a deposition process, e.g., a CVD method. A deposition process of this kind allows the access to be closed off at particularly low process pressures. This is advantageous for the production of caverns having a low internal atmospheric pressure.

It is additionally advantageous that the method steps of opening the accesses and subsequently closing them off at a specifiable atmospheric pressure can be performed several times successively. It is possible as a result to manufacture further caverns have different specifiable atmospheric pressures.

DETAILED DESCRIPTION

Figure 1:
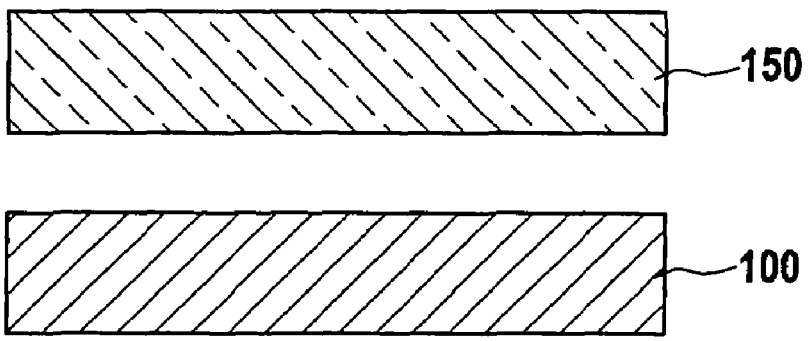
FIG. 1 shows the preparation of a substrate and of a glass.

FIG. 1 shows the preparation of a substrate and a glass for the manufacture of a cap. A cap substrate 100, which in this example is made of silicon, is disposed and aligned with respect to a glass 150. Glass 150 is made of Pyrex in this example. For joining, cap substrate 100 and glass 150 must exhibit a suitable roughness on the surfaces facing one another.

Figure 2:
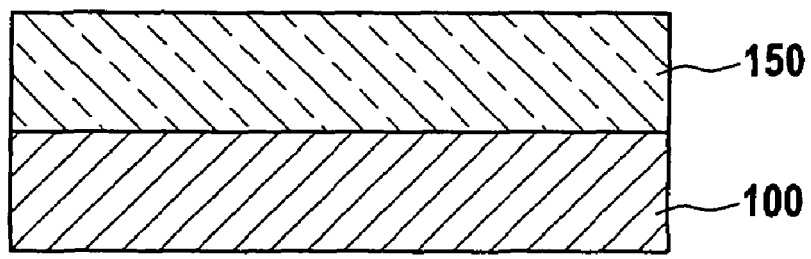
FIG. 2 shows the joining of the substrate and glass by anodic bonding.

FIG. 2 shows the joining of substrate 100 to glass 150. The joining is accomplished, for example, by way of the technique of anodic bonding.

Figure 3:
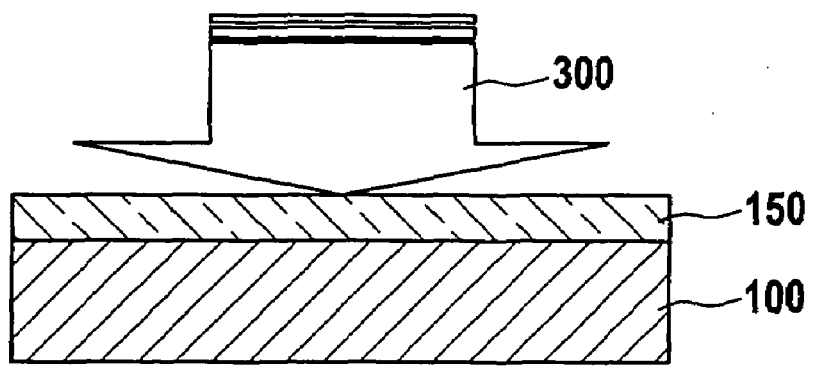
FIG. 3 shows the thinning of the glass layer.

FIG. 3 shows the thinning of the glass layer. Thinning action 300 of glass 150 is accomplished by grinding and chemical-mechanical polishing (CMP). The result is to produce, in this example, a glass layer 150 having a thickness of approx. 50 μm.

Figure 4:
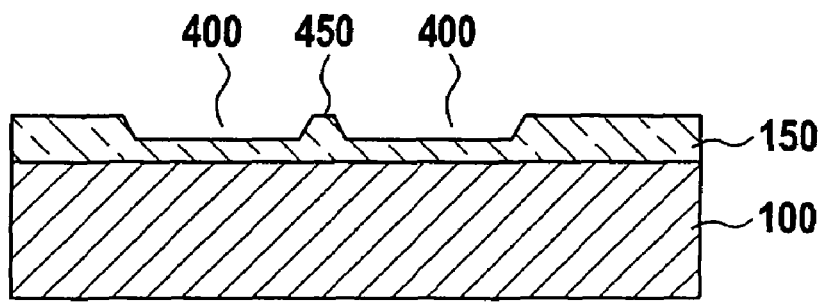
FIG. 4 shows the etching of recesses into the glass.

FIG. 4 shows the production of recesses in the glass. Recesses 400 in glass 150 can be produced, for example, by a buffered oxide etch (BOE) method. In the example shown, recesses 400 have a depth of approx. 5.5 μm. Provision can be made to leave supporting regions 450 when producing the recesses.

Figure 5:
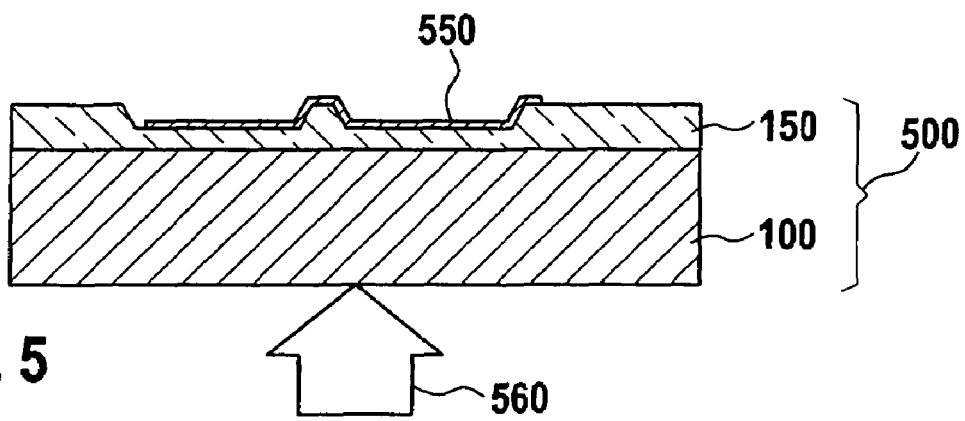
FIG. 5 shows the application of a shield and parallelizing of the substrate.

FIG. 5 shows the production of a shield and the parallelizing of the cap substrate. To produce a shield 550, a metal layer is deposited onto regions of glass layer 150, in particular in the region of recesses 400 and support region 450. This metal layer can be made, for example, of aluminum, and here has a thickness of approx. 400 nm. The metal layer can be deposited, if necessary, in structured fashion, or can also be structured after deposition. Shield 550 can optionally have a contact tab 555, such that a conductive connection can be contacted thereon.

In the next manufacturing step, cap substrate 100 is parallelized. Parallelizing action 560 is accomplished from the back side of cap substrate 100. The purpose of parallelizing action 560 is to ensure that the substantially disk-shaped cap substrate 100 has approximately the same thickness (approx. 450 μm in this example) everywhere. Cap substrate 100, glass layer 150, and shield 550 together form a cap 500.

Figure 6:
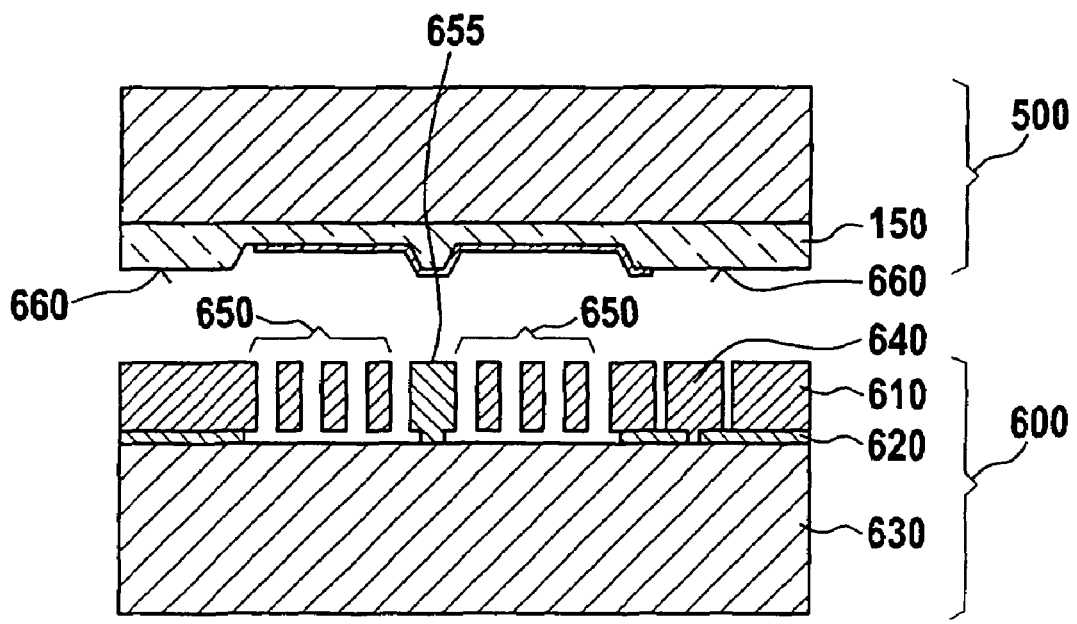
FIG. 6 shows the alignment of a cap with respect to a micromechanical component.

FIG. 6 shows the alignment of the cap with respect to a micromechanical component. Micromechanical component 600 has a micromechanical functional layer 610 made of polycrystalline silicon, a dielectric layer 620 made of silicon oxide, and a component substrate 630 made of silicon. Micromechanical functional layer 610 has a connection region 640, micromechanical structures 650, and optionally support mounts 655. On the surface facing toward micromechanical component 600, glass layer 150 in cap 500 has bonding surfaces 660.

Figure 7:
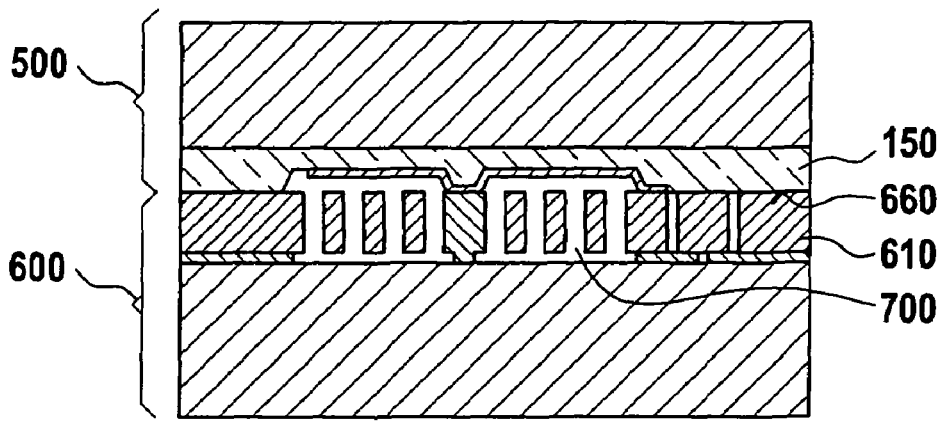
FIG. 7 shows the joining of the component and cap.

FIG. 7 shows the joining of component and cap, in which cap 500 is anodically bonded to component 600 at bonding surfaces 660. This material join of glass layer 150 to micromechanical functional layer 610 is hermetically sealed. As a result, cap 500 and micromechanical component 600 delimit at least one cavern 700.

Figure 8:
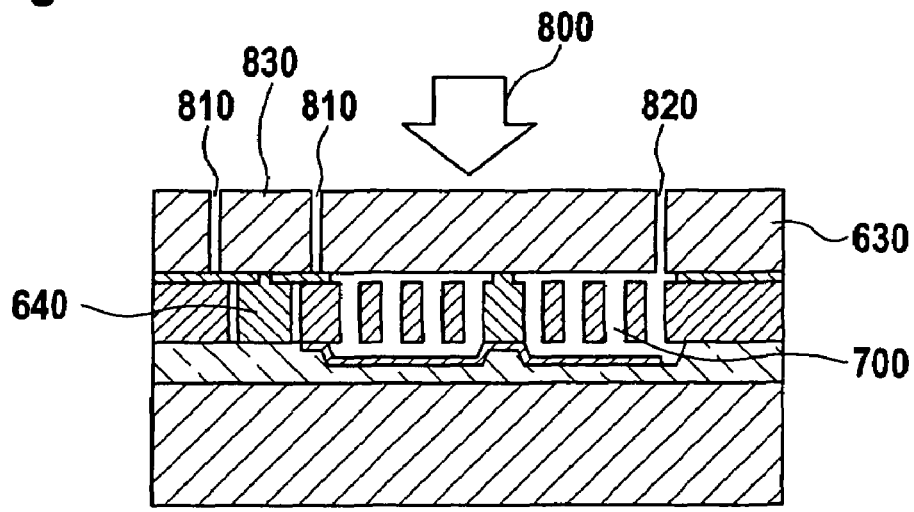
FIG. 8 shows the production of an access opening to a cavern.

FIG. 8 shows the production of an access opening to a cavern. Firstly, a thinning action 800 of component substrate 630 to a thickness of approx. 125 μm occurs. Thinning action 800 is performed, for example, by grinding and polishing. Trenches 810 that isolate contact regions 830 from the remaining component substrate 630 are then introduced into component substrate 630. In the same manufacturing step, an access opening 820 to cavern 700 is introduced into component substrate 630. The internal atmospheric cavern pressure is equalized with the ambient pressure through access opening 820.

Figure 9:
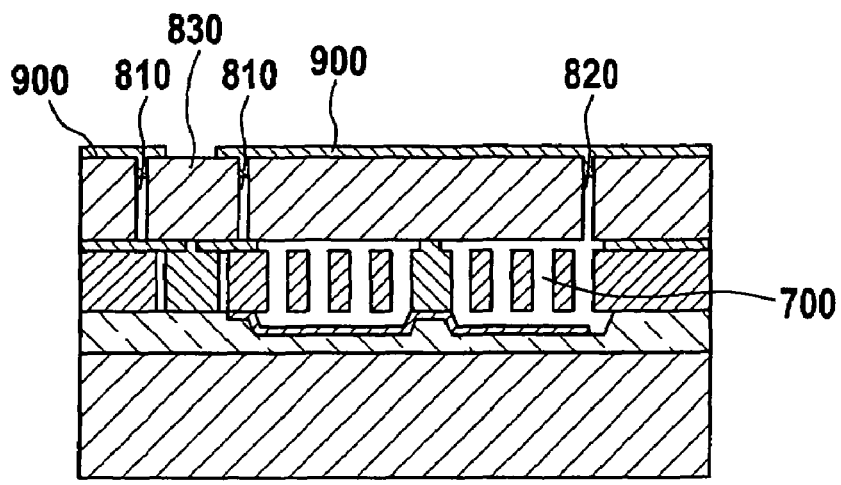
FIG. 9 shows the closing off of the access opening.

FIG. 9 shows the closing off of the access opening. For this, component substrate 630 is coated with an oxide 900; this is done, for example, using a CVD method. Oxide 900 fills insulating trenches 810, closes off access opening 820, and furthermore coats component substrate 630. The process pressure during coating, which can be less than $10^{-3}$ bar, is thereby enclosed in cavern 700. Contact region 830 is at least partially exempted from the coating with oxide 900.

Figure 10:
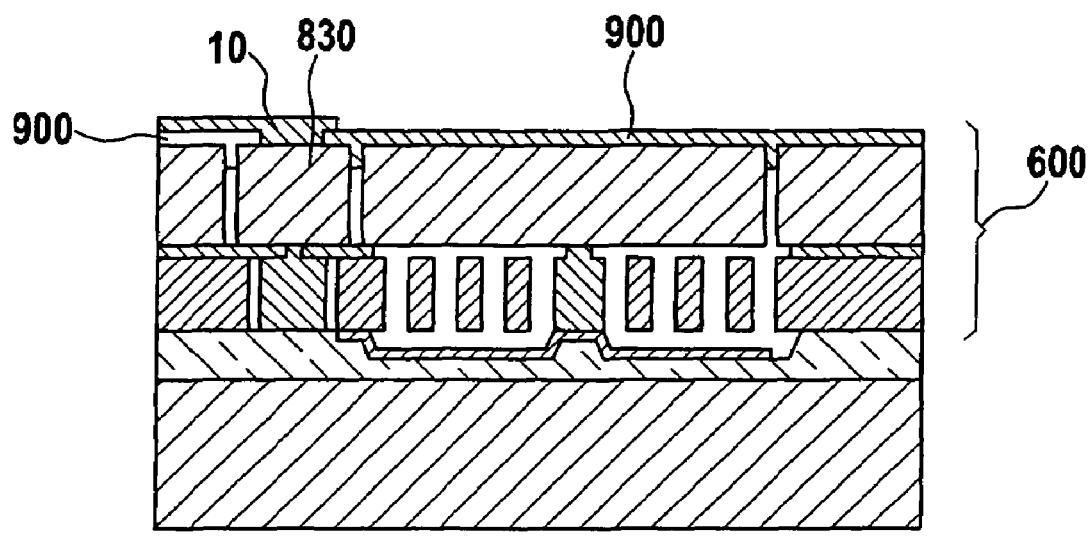
FIG. 10 shows the production of a back-side contact.

FIG. 10 shows the production of a back-side contact on micromechanical component 600, a metallization 10 being applied onto contact region 830 and locally onto oxide 900. Metallization 10 can be structured during application, or also in a later manufacturing step. Contacts to conductive regions in the interior of the micromechanical component, as well as contacts and conductive paths on the surface, can be produced by way of this process step.

Figure 11:
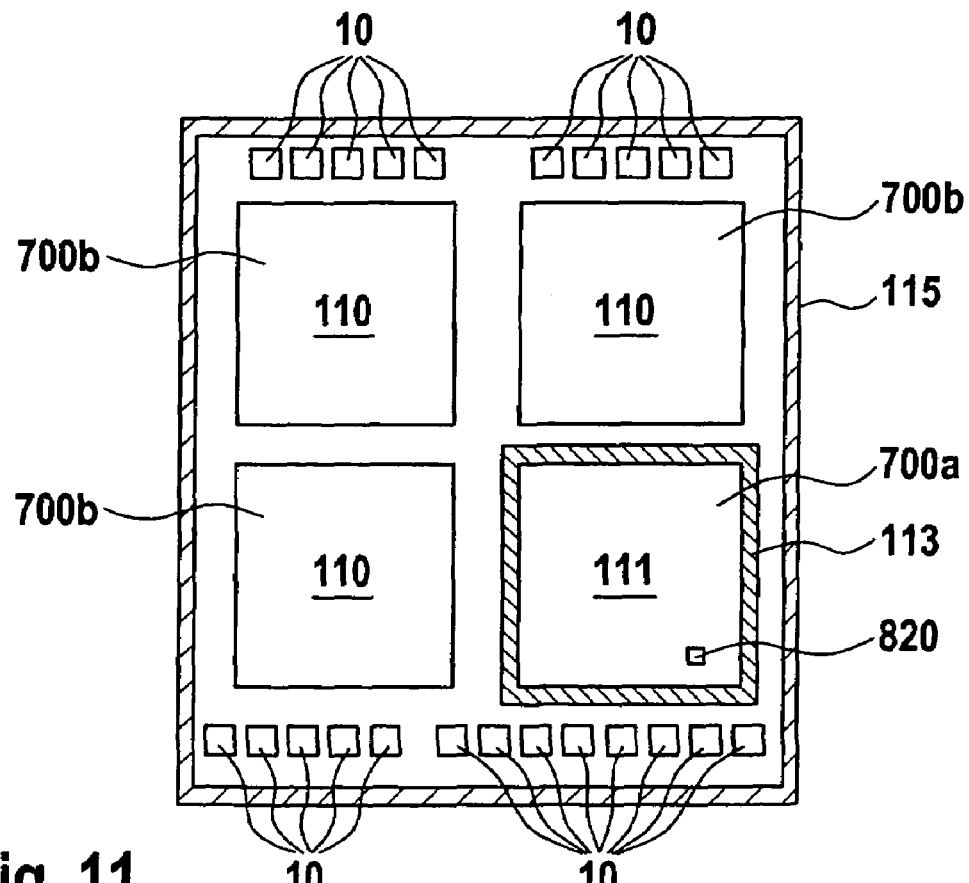
FIG. 11 shows an assemblage of multiple caverns in one micromechanical component.

FIG. 11 shows a micromechanical component according to the present invention having multiple caverns. The component is depicted schematically and in plan view. Caverns 700a, b are located in the interior of the micromechanical component, and in this example are formed by a single common cap on the component. The cap and component have joining surfaces 660 that, in this example, form a first bonding frame 113 and a second bonding frame 115 after anodic bonding. First bonding frame 113 encloses a cavern 700a that has a closed-off access opening 820. A very low internal atmospheric pressure exists in this cavern 700a; an internal pressure of less than $10^{-3}$ bar is conceivable. Cavern 700a accommodates a micromechanical functional element 111 that operates, as governed by its design, at very low pressures. This can be, for example, a micromechanical rotation-rate sensor or another high-quality micromechanical oscillator. The vacuum in cavern 700a is hermetically closed off from ambient pressure by bonding frame 113.

In this example, the micromechanical component has three further caverns 700b that have no access opening 820 at all. These caverns 700b contain substantially the process pressure that existed during the process step of anodic bonding. These can be, for example, pressures between 5 mbar and 1.5 bar. Disposed in these caverns 700b are functional elements 110 that, as governed by their design, function at higher pressures or are more tolerant to higher working pressures. Micromechanical functional elements 110 can be, for example, acceleration sensor structures that operate in damped fashion at the indicated internal atmospheric pressure of caverns 700b.

The three caverns 700b having the higher internal pressure are hermetically closed off by bonding frame 113 from the vacuum in fourth cavern 700a. Furthermore, all the caverns 700a, b are hermetically closed off from the outside world by the common bonding frame 115. In this example, the three caverns 700b having the higher internal pressure are not separated from one another by further bonding frames, since substantially the same internal cavern pressure exists in them in any case after the process step of anodic bonding.

Lastly, FIG. 11 also depicts contact surfaces 10 produced by metallization. By way of these contact surfaces, the micromechanical component can, for example, be connected to an external evaluation circuit (not depicted here). It is also conceivable, however, to integrate the evaluation circuit into the micromechanical component.

Further embodiments of the micromechanical component are possible.

What is claimed is:

1. A micromechanical unit, comprising:
   a micromechanical component; and
   at least one cap interfacing the micromechanical component;
   wherein the micromechanical unit has at least two caverns delimited by interfacing of the at least one cap and the micromechanical component, wherein the at least two caverns have different internal atmospheric pressures, and wherein the internal atmospheric pressure of at least a first cavern is determined by the interfacing, and the internal atmospheric pressure of at least a second cavern is determined by a closed-off access opening,
   wherein the access opening of the at least one cavern is sealed with an oxide, and
   wherein the access opening extends through a substrate of the micromechanical component.

2. The micromechanical unit as recited in claim 1, wherein the at least two caverns are delimited by interfacing of one common cap and the micromechanical component.

3. The micromechanical unit as recited in claim 1, wherein the micromechanical unit has a buried conductor structure.

4. The micromechanical unit as recited in claim 1, further comprising:
   at least one contact mechanism for electrical contacting, wherein the at least one contact mechanism is located at a contact region of the substrate of the micromechanical component.

5. The micromechanical unit as recited in claim 1, wherein at least one cavern is sealed by a peripheral hermetic material seal.

6. The micromechanical unit as recited in claim 1, wherein the at least two caverns are sealed by a common peripheral hermetic material seal.

7. The micromechanical unit as recited in claim 1, wherein the at least one cap includes a silicon substrate that is joined to a glass layer.

8. The micromechanical unit as recited in claim 1, wherein the at least one cap has at least one recess in order to form at least a part of a cavern.

9. A method for manufacturing a micromechanical unit, comprising:
   interfacing a micromechanical component and a cap to delimit at least two caverns, wherein the micromechanical component and the cap are hermetically joined to one another at a first specified atmospheric pressure, wherein the first specified atmospheric pressure is determined by the interfacing;
   providing an access to at least one cavern; and
   hermetically sealing the access at a second specified atmospheric pressure, wherein the second specified atmospheric pressure is determined by the hermetically sealing of the access,
   wherein the access of the at least one cavern is sealed with an oxide, and
   wherein the access extends through a substrate of the micromechanical component.

10. The method as recited in claim 9, wherein the cap includes a silicon substrate joined a glass by anodic bonding.

11. The method as recited in claim 10, further comprising:
   producing at least one recess in the glass in order to form a cavern.

12. The method as recited in claim 9, wherein the micromechanical component and the cap are joined to one another by anodic bonding.

13. The method as recited in claim 9, wherein the access is produced in the substrate of the micromechanical component.

14. The method as recited in claim 9, wherein the access is sealed by a deposition process.

15. The method as recited in claim 9, further comprising:
   providing an access to an additional cavern; and
   hermetically sealing the access to the additional cavern at a third specified atmospheric pressure.

16. The micromechanical unit as recited in claim 1, wherein the at least two caverns include a first cavern housing a first sensor, and a second cavern housing a second sensor.

17. The micromechanical unit as recited in claim 16, wherein differences in atmospheric pressures of the at least two caverns are at least partially dictated by the sensors housed within each of the at least two caverns.

18. The micromechanical unit as recited in claim 1, wherein the at least two caverns include a first cavern having a first atmospheric pressure of approximately 5 mbar to 1.5 mbar, and a second cavern having a second atmospheric pressure of approximately 0.003 bar or less.

19. The method as recited in claim 9, wherein hermetically sealing the access at a second specified atmospheric pressure includes hermetically sealing the access such that the atmospheric pressure of the at least one cavern is less than the atmospheric pressure of another cavern of the at least two caverns.

20. The method as recited in claim 9, wherein hermetically sealing the access at a second specified atmospheric pressure includes hermetically sealing the access such that the at least one cavern has an atmospheric pressure of approximately 0.003 bar or less.

21. The method as recited in claim 9, further comprising:
   providing a first sensor in a first cavern of the at least two caverns, and providing a second sensor in the at least one cavern to which access has been provided.

* * * * *